(12) United States Patent
Zlotnik et al.

(10) Patent No.: US 12,218,681 B2
(45) Date of Patent: Feb. 4, 2025

(54) BIT MASK FOR SYNDROME DECODING OPERATIONS

(71) Applicant: Micron Technology, Inc., Boise, ID (US)

(72) Inventors: Leon Zlotnik, Camino, CA (US); Eyal En Gad, Highland, CA (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/949,635

(22) Filed: Sep. 21, 2022

(65) Prior Publication Data
US 2024/0097707 A1 Mar. 21, 2024

(51) Int. Cl.
*H03M 13/00* (2006.01)
*H03M 13/11* (2006.01)
*H03M 13/15* (2006.01)

(52) U.S. Cl.
CPC .... *H03M 13/1111* (2013.01); *H03M 13/1575* (2013.01); *H03M 13/611* (2013.01)

(58) Field of Classification Search
CPC .......... H03M 13/1111; H03M 13/1575; H03M 13/611
USPC ......................................................... 714/763
See application file for complete search history.

(56) References Cited

U.S. PATENT DOCUMENTS

| | | | |
|---|---|---|---|
| 5,570,306 A * | 10/1996 | Soo | G06F 7/02 708/212 |
| 6,260,087 B1 | 7/2001 | Chang | |
| 7,426,678 B1 * | 9/2008 | Cory | H03M 13/27 714/785 |
| 8,397,143 B2 | 3/2013 | Neznanov et al. | |
| 8,656,250 B2 | 2/2014 | Gunnam et al. | |
| 2002/0013876 A1 * | 1/2002 | Rosa | G11C 16/10 714/763 |
| 2007/0130496 A1 * | 6/2007 | Kanno | G06F 11/1072 714/763 |
| 2008/0050027 A1 * | 2/2008 | Bashyam | H04N 19/132 382/238 |
| 2009/0210772 A1 * | 8/2009 | Noguchi | G11C 16/3427 714/764 |
| 2010/0257429 A1 * | 10/2010 | Noguchi | G11C 16/0483 714/763 |
| 2014/0074719 A1 * | 3/2014 | Gressel | G06Q 30/06 713/168 |

(Continued)

*Primary Examiner* — Mujtaba M Chaudry
(74) *Attorney, Agent, or Firm* — Brooks, Cameron & Huebsch, PLLC

(57) ABSTRACT

A decoding operation is performed by altering at least one bit of the bit string from a first value to a second value and applying a bit mask to each bit of the bit string that is not altered from the first value to the second value. The decoding operation further includes writing an indication corresponding to a quantity of bits that have been altered from the first value to the second value to an array of memory cells, wherein the indication corresponds to a quantity of errors contained in the bit string, determining that the quantity of errors for the bit string has reached a threshold quantity of errors, and refraining from performing a subsequent operation to alter at least the one bit of the bit string, or a different bit of the bit string, or both, from the first value to the second value in response to determining that the quantity of errors for the bit string has reached the threshold quantity of errors.

27 Claims, 6 Drawing Sheets

(56) References Cited

U.S. PATENT DOCUMENTS

2020/0004627 A1\* 1/2020 Sharon .................... G06F 3/064
2020/0388326 A1\* 12/2020 He .................... G11C 11/40618

\* cited by examiner

BIT MASK FOR SYNDROME DECODING OPERATIONS

TECHNICAL FIELD

Embodiments of the disclosure relate generally to digital logic circuits, and more specifically, relate to a bit mask for syndrome decoding operations.

BACKGROUND

A memory sub-system can include one or more memory devices that store data. The memory devices can be, for example, non-volatile memory devices and volatile memory devices. The memory sub-system can include one or more analog and/or digital circuits to facilitate operation of the memory sub-system. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
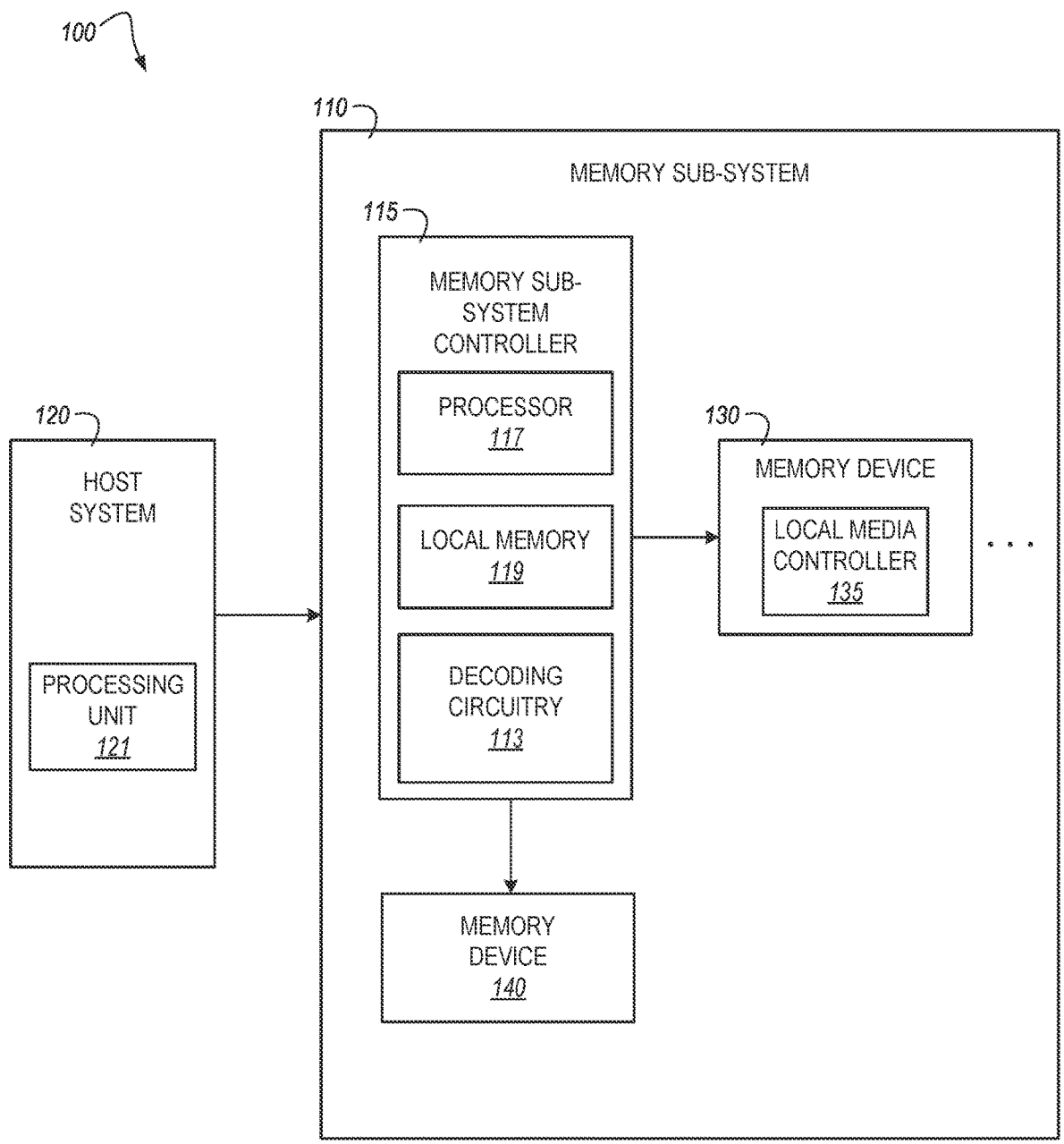
FIG. 1 illustrates an example computing system that includes a memory sub-system in accordance with some embodiments of the present disclosure.

Aspects of the present disclosure are directed to a bit mask for operations within a memory sub-system that cycle, manipulate, and/or iterate data, such as bit strings, syndromes, etc. In some embodiments, such operations can include decoding operations and, in particular, decoding operations performed within a memory sub-system that includes a syndrome decoding system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

During operation of the memory sub-system, data is written to and stored by one or more memory devices. The data (e.g., one or more codewords that can correspond to, for example, user data) can be encoded prior to being transferred to the memory device(s) and/or prior to being written to (e.g., stored) by the memory device(s). Upon retrieval of the data, the data is generally decoded. There are many techniques for decoding of codewords, some non-limiting examples of which include maximum likelihood decoding, minimum distance decoding (e.g., decoding techniques that seek to minimize a Hamming distance associated with a codeword), list decoding, and/or information set decoding, among others.

As will be appreciated such decoding techniques can be employed in a memory sub-system to detect bit errors in data, e.g., codewords, based on determining that bits associated with the data have incorrect states (e.g., a "1" where a "0" should be and vice versa). Some of the more common decoding techniques employed in the context of memory sub-systems include Hamming codes, Reed-Solomon (RS) codes, Bose-Chaudhuri-Hochquenghem (BCH) codes, circular redundancy check (CRC) codes, Golay codes, Reed-Muller codes, Goppa codes, neighbor-cell assisted error correction codes, low-density parity-check (LDPC) error correction codes, Denniston codes, and syndrome decoding, among others. While each of these decoding techniques enjoy their own benefits, they also can experience various drawbacks. For example, more accurate decoding techniques tend to consume more power and/or time, while less accurate decoding techniques may be performed faster and may consume less power. In the interest of clarity, the present disclosure will be described in terms of linear codes, such as LDPC codes and/or syndrome decoding, which may be generally referred to herein as "decoding techniques," given the context of the disclosure; however, it will be appreciated that the techniques described herein apply to other decoding techniques as well.

In some approaches decoding of bit strings and/or syndromes is achieved by processing the bit strings and/or syndromes through a series of flip-flops (which can include thousands of flip-flops) and applying a logical operation (e.g., a logical OR operation) to the bit strings and/or syndromes. In such approaches, the quantity of inputs of the logical operation is generally equal to the quantity of flip-flops used to process the bit strings and/or syndromes. If performance of the logical operation returns a particular value (e.g., a logical value of "0" in the case of a logical OR operation), the bit strings and/or syndromes are considered to be decoded.

For example, some approaches may utilize around 5,000 to 10,000 flip-flops to decode a set of bit strings and/or syndromes. In such approaches, a logic gate having around 5,000 to 10,000 inputs is required to perform a logical operation involving the bit strings and/or syndromes to determine whether the result of the logical operation returns the particular value. If the logical operation fails to return the particular value, all of the bit string and/or syndromes are fed back through the array of flip-flops and the logical operation is performed again. Given the quantity of flip-flops, the number of inputs on the logic gate, and the repetitive nature of performing decoding operations under such approaches, it is clear that a large amount of computing resources (e.g., power, time, etc.) can be consumed in decoding a set of bit strings and/or syndromes. Further, because such approaches generally process all the bit strings and/or syndromes iteratively until the result of the logical operation returns the particular value, for at least some iterations there may be fully decoded bit strings and/or syndromes that are being fed through the flip-flop array and logic despite being fully decoded.

Further, in some approaches, if can be difficult to prematurely abort the decoding operation, e.g., if it is determined that the bit strings and/or syndromes contain too many uncorrectable errors for the logical operation to ever result in the particular value and/or if it is determined that the decoding operation would take greater than a threshold period of time to complete. As an example, some approaches require the use of an adder device that can have around as many inputs as there are flip-flops and/or inputs to the logic gate in order to determine if a decoding operation should be aborted. In such approaches, all of the bit strings and/or syndromes may be summed by the adder to determine that the decoding operation should be aborted. This can add not only additional large circuitry to a system but can also consume additional computing resources above and beyond the computing resources already being consumed due to the repetitive nature of performing decoding operations under such approaches and the quantity of flip-flops and logic gate inputs utilized in such approaches, as mentioned above.

In order to address these and other deficiencies of current approaches, embodiments of the present disclosure allow for the tracking and checking of individual bit strings and/or syndromes during a decoding operation to determine whether the bit strings and/or syndromes have been successfully decoded. In some embodiments, this check is performed prior to the bit strings and/or syndromes being written back to an array of memory cells (e.g., an array of flip-flops) from which the bit strings and/or syndromes are retrieved and/or re-written in the case of bit strings and/or syndromes that are not fully decoded.

The check can include performing an operation to sum all the digits in the bit strings and/or syndromes that are non-zero (i.e., that contain an erroneous bit) to determine how many bits in error remain in each of the bit strings and/or syndromes. In addition, embodiments described herein provide an additional array of memory cells (or array of flip-flops, etc.) that can store and/or track the sums of the non-zero bits of each of the bit strings and/or syndromes while the digits in the bit strings and/or syndromes approach all zeros, which is indicative of the bit strings and/or syndromes being successfully decoded.

Once the digits contained in a particular bit string and/or syndrome reach zero (e.g., once the bit string and/or syndrome is successfully decoded), a "tracking sum" value of zero can be associated with the bit string and/or syndrome. This tracking sum value is then stored in the additional array of memory cells (or array of flip-flops, etc.) that stores and/or tracks the sums of the non-zero bits of each of the bit strings and/or syndromes. For bit strings and/or syndromes that have a tracking sum value of zero associated therewith, these bit strings and/or syndromes are no longer selected for processing in subsequent decoding operations. For example, in some embodiments, an input to a multiplexer that selects bit strings and/or syndromes to be read from the array of memory cells (e.g., an array of flip-flops) from which the bit strings and/or syndromes are retrieved and/or re-written in the case of bit strings and/or syndromes that are not fully decoded can be deselected such that bit strings and/or syndromes that have a tracking sum value of zero are no longer read from the array as part of a decoding operation.

In contrast, the bit strings and/or syndromes that do not have a tracking sum value of zero are subjected to a further iteration of a decoding operation and a new tracking sum value is determined subsequent to performance of each iteration of the decoding operation until the tracking sum values for the bit strings and/or syndromes have reached zero. In addition, embodiments herein provide for the decoding operation to be aborted simply by determining that a tracking sum value for one or more of the bit strings and/or syndromes and/or a tracking sum value associated with all of the bit strings and/or syndromes exceeds a threshold tracking sum value.

By removing the requirement exhibited in previous approaches that all of the bit strings and/or syndromes are iteratively decoded until all of the bit strings and/or syndromes have been decoded, embodiments of the present disclosure can reduce power consumed in performance of such decoding operations. For example, at least because bit strings and/or syndromes that have been successfully decoded are not re-processed, in contrast to previous approaches, embodiments herein reduce the amount of power consumed and the amount of time spent in decoding bit strings and/or syndromes, thereby improving the performance of a computing system in which embodiments of the present disclosure operate. Further, by providing a simplified approach to aborting a decoding operation (e.g., an approached based on a simple threshold), embodiments of the present disclosure can allow for decoding operations that may never converge (e.g., that may never be fully decoded due to the presence of a large number of uncorrectable errors, decoding operations that may take greater than a threshold period of time to complete, etc.) to be aborted efficiently and timely, thereby reducing the amount of power consumed and the amount of time spent in decoding bit strings and/or syndromes that may never converge and therefore improving the performance of a computing system in which embodiments of the present disclosure operate.

Further, embodiments of the present disclosure can reduce an amount of time consumed in performance of such decoding operations. For example, at least because bit strings and/or syndromes that have been successfully decoded are not re-processed, in contrast to previous approaches, it may be possible to speed up performance of the decoding operation. That is, because the data paths and/or logic corresponding to the various syndromes can be stalled once the syndromes have a value of zero (e.g., the syndrome no longer contains error indications), a subsequent non-zero syndrome can be processed while refraining from processing syndromes having a value of zero. In addition to reducing the dynamic power and leakage power consumed during the decoding operation, this can allow for non-zero syndromes to be processed (e.g., decoded) faster than previous approaches.

Moreover, embodiments of the present disclosure provide for bits of the bit strings and/or syndromes that have been successfully decoded prior to the entire bit string and/or syndrome being successfully decoded to be masked such that subsequent iterations of a decoding operation are not performed using the successfully decoded bits. For example, if a first quantity of bits of the bit strings and/or syndromes have been successfully and a second quantity of bits of the bit strings and/or syndromes have not been successfully decoded, embodiments herein provide that subsequent decoding operations are only performed on the bits of the bit strings and/or syndromes that have not been successfully decoded. This can be achieved through the use of a bit mask that can be applied to bits of the bit strings and/or syndromes that have been successfully decoded. By performing iterations of a decoding operation using only the unmasked bits (e.g., the bits of the bit strings and/or syndromes that have not been successfully decoded), an amount of computing resources consumed in performance of the decoding operation can be reduced, thereby improving the performance of a computing system in which embodiments of the present disclosure operate.

For example, in contrast to approaches that employ a read-modify-write paradigm (and, more specifically, to write operations) during decoding operations, which can lead to fairly large power consumption in performance of the decoding operation, embodiments herein reduce the power consumed in performance of the decoding operation by utilizing a masked memory write, which can allow for only certain bits to be read, modified, and/or written during performance of the decoding operation, as the masked bits are not required to be read, modified, and/or written to a memory device during iterations of the decoding operation. This can be particularly beneficial in system-on-chip applications where minimizing power consumption can be a high priority. In some embodiments, the mask can be applied to bits that have not been flipped by, for example, decoding (e.g., decision) circuitry that is used to perform the decoding operation. As will be appreciated, a bit string and/or syndrome that is subjected to a decoding operation may contain 99% accurate data (e.g., bits that do not need to be flipped as part of the decoding operation). Accordingly, by refraining from performing read-write-modify operations involving these bits (that, is by applying a mask to these bits), the vast majority of bits in a bit string and/or syndrome that is being decoded may not need to incur power and/or bandwidth hits employed by the previous approaches described above.

Embodiment of the present disclosure and, in particular, embodiments related to the bit masking techniques described herein are not only applicable to decoding of bit strings and/or syndromes, however. For instance, embodiments described herein can allow for selective masking of bits contained in any generally sequential series of bits or other values stored by a computing system that can be subjected to read-write-modify operations. As an example, bit strings written to a register of a computing system may be shifted (e.g., from one address location to a different address location) during operation of the computing system. These bit strings can contain sequential data and the shifting operations can involve performance of one or more read-modify-write operations. In accordance with embodiments of the present disclosure, one or more bits of a bit string that is subjected to such a shifting operation can be masked thereby reducing the power consumed in performance of a read-modify-write operation to shift the bit string to a different address location within the register. Embodiments are not so limited, however and, as mentioned above, it will be appreciated that embodiments that include utilization of the bit masking techniques described herein can generally be applied to any bit string that includes sequentially written data.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the voltage sensing circuit 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include decoding circuitry 113. Although not shown in FIG. 1 so as to not obfuscate the drawings, the decoding circuitry 113 can include various circuitry to facilitate aspects of the disclosure described herein. In some embodiments, the decoding circuitry 113 can include special purpose circuitry in the form of an ASIC, FPGA, state machine, hardware processing device, and/or other logic circuitry that can allow the decoding circuitry 113 to orchestrate and/or perform operations to provide bit string and/or syndrome decoding, particularly with respect to a system-on-chip, in accordance with the disclosure. The decoding circuitry 113 is discussed in more detail in connection FIG. 2 and FIG. 3, herein.

In some embodiments, the memory sub-system controller 115 includes at least a portion of the decoding circuitry 113. For example, the memory sub-system controller 115 can include a processor 117 (processing device) configured to execute instructions stored in local memory 119 for performing the operations described herein. In some embodiments, the decoding circuitry 113 is part of the host system 110, an application, or an operating system. The decoding circuitry 113 can be resident on the memory sub-system 110 and/or the memory sub-system controller 115. As used herein, the term "resident on" refers to something that is physically located on a particular component. For example, the decoding circuitry 113 being "resident on" the memory sub-system 110, for example, refers to a condition in which the hardware circuitry that comprises the decoding circuitry 113 is physically located on the memory sub-system 110. The term "resident on" may be used interchangeably with other terms such as "deployed on" or "located on," herein.

Figure 2:
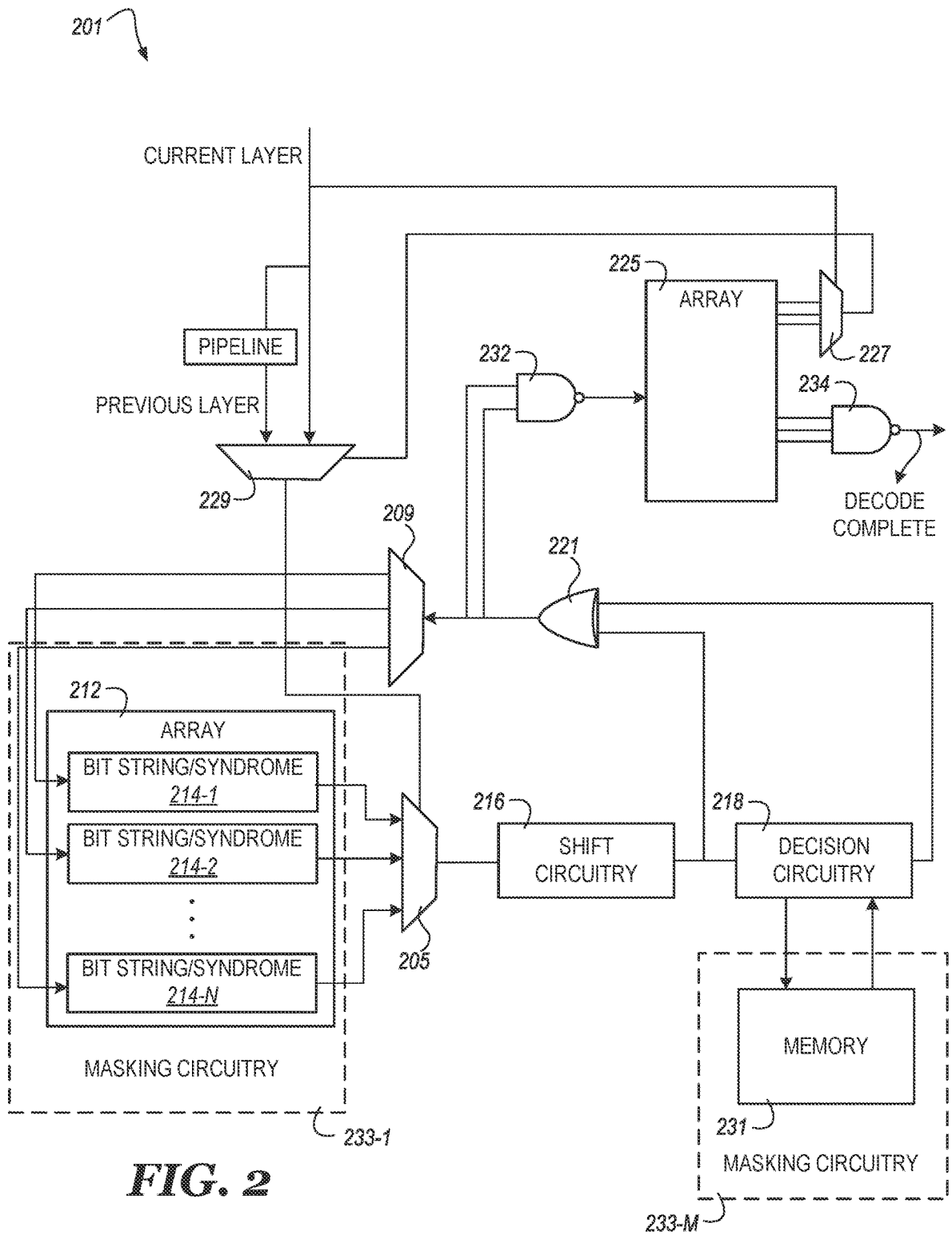
FIG. 2 illustrates an example of a syndrome decoding system in accordance with some embodiments of the present disclosure.

FIG. 2 illustrates an example of a syndrome decoding system 201 in accordance with some embodiments of the present disclosure. The syndrome decoding system 201 includes at least a portion of the decoding circuitry 113 illustrated in FIG. 1. The example system 201, which can be referred to in the alternative as an "apparatus," includes an array 212 (e.g., a "first" array) that can include devices configured to store bit strings and/or syndromes 214-1, 214-2, to 214-N, (which can be referred to collectively as bit strings and/or syndromes 214). In some embodiments, the bit strings and/or syndromes 214 comprise codewords that are utilized by the memory sub-system 110. As used herein, the term "codeword" generally refers to a data word having a specified size (e.g., 4 KB, etc.) that is encoded such that the codeword can be individually protected by some error encoding and/or decoding scheme. For example, a "codeword" can refer to a set of bits (e.g., a bit string and/or a syndrome) that can be individually encoded and/or decoded. In general, for NAND type memory devices, a "codeword" can represent the smallest unit (e.g., set of bits) that can be read by a memory device, host device, or other computing device associated with the system 201. Although not explicitly shown in FIG. 2, one or more of the components illustrated can be one of a plurality of such components. For example, the decision circuitry 218 can be a single decision circuit 218 of any quantity of decision circuits 218 (e.g., there can be eight, ten, twelve, etc. decisions circuits 218, eight, ten, twelve, etc. shift circuits, 216, etc. although embodiments are not limited to this particular quantity).

The array 212 can be an array of memory cells and/or an array of flip-flops and/or latches, etc. As shown in FIG. 2, the array 212 is coupled to a multiplexer (or "MUX") 205 that is configured to selectively transfer one or more of the bit strings and/or syndromes 214 to shift circuitry 216. In some embodiments, the shift circuitry 216 can comprise a barrel shifter that is configured to shift the bit strings and/or syndromes 214 by a specified number of bits. That is, in some embodiments, the shift circuitry 216 can shift the bit strings and/or syndromes 214 by a specified number of bits using pure combinatorial logic. Embodiments are not so limited, however, and it is contemplated within the disclosure that the shift circuitry 216 can be configured to perform shift operations involving the bit strings and/or syndromes 214 utilizing other combinatorial logic techniques (e.g., circular shifting, etc.) and/or sequential logic techniques.

The shift circuitry 216 is coupled to decision circuitry 218. The decision circuitry 218 includes hardware circuitry that is configured to correct erroneous bits (e.g., bit-flip errors) in the bit strings and/or syndromes 214. In some embodiments, the decision circuitry 218 can cause one or more bits in the bit strings and/or syndromes 214 to be flipped based on a determined probability that such bits are erroneous. The probability that one or more bits in the bit strings and/or syndromes 214 is to be flipped can be determined using various linear codes, such as syndrome decoding codes, LDPC codes, etc. Embodiments are not limited to cases in which the decision circuitry 218 causes one or bits in the bit strings and/or syndromes 214 to be flipped based on a determined probability that such bits are erroneous (e.g., through the use of a linear decoding technique), however, and in some embodiments, the decision circuitry 218 can determine which bits of the bit strings and/or syndromes 214 are erroneous based on mathematical inference algorithms, machine learning algorithms, and/or other suitable techniques for determining which bits of the bit strings and/or syndromes 214 are erroneous.

In a simplified example that is provided for illustrative purposes, take a syndrome 214 that contains the following bit pattern: [1 0 0 1 0 1 1 0], the decision circuitry 218 may determine that, the second bit (from the right) is likely to be erroneous and can therefore process the syndrome 214 to flip the second bit thereby yielding the following new syndrome [1 0 0 1 0 1 0 0]. Such bit flip gets the decoder closer to a codeword (in which all the syndrome bits are zero), Embodiments are not limited to scenarios in which the decision circuitry 218 causes only a single bit to be flipped as part of decoding the syndromes 214, however. For example, using the same initial syndrome given above [1 0 0 1 0 1 1 0], the decision circuitry 218 may determine that the second bit, the third bit, and the eighth bit are likely to be erroneous and can therefore process the syndrome 214 to flip the second bit, the third bit, and the eighth bit thereby yielding the following new syndrome [0 0 0 1 0 0 0 0]. It is noted that these illustrative non-limiting examples can be part of an iterative decoding process in which the syndrome 214 are processed by the decision circuitry 218 multiple times in an effort to decode such syndromes 214. Accordingly, the illustrative non-limiting example given above can represent operations performed by the decision circuitry 218 at a first iteration of the decoding process, or at any subsequent iteration of the decoding process.

Once the decision circuitry 218 has attempted to correct one or more erroneous bits in the bit strings and/or syndromes 214, for example by flipping a value of one or more such bits from a logical value of "1" to a logical value of "0" or vice versa, the decision circuitry, the masking circuitry 233-M, and/or other circuitry of the system 201 can mask (e.g., provide a bit mask) bits of the bit strings and/or syndromes 214 that have not been attempted to be corrected. Any bits of the bit strings and/or syndromes 214 that have the mask applied thereto will not be subject to correction by the bit string circuitry 214 during subsequent iterations of a decoding operation and/or may not be processed by the decision circuitry 218 during subsequent iterations of the decoding operation.

For example, using an initial bit pattern given above [1 0 0 1 0 1 1 0], the decision circuitry 218 may determine that the second bit, the fifth bit, and the seventh bit are likely to be erroneous and can therefore process the received bit string and/or syndrome 214 to flip the second bit, the fifth bit, and the seventh bit thereby yielding the following bit pattern [1 1 0 1 1 1 0 0]. The mask is then applied to the first bit, the third bit, the fourth bit, and the sixth bit, as these bits were not determined as likely to be erroneous and therefore were not altered by the decision circuitry 218. In some embodiments, the bits having the mask applied thereto (and/or the bits not having the mask applied thereto) are written to the memory 231 (which can be a register, cache, or other collection of memory cells) of the masking circuitry 233-M. The bits that do not have the mask applied thereto can be further processed by the decision circuitry 218 to correct one or more erroneous bits in the bit strings and/or syndromes 214 that may be present after the previous attempt to correct the one or more erroneous bits in the bit strings and/or syndromes 214. Similarly, when unchanged (e.g., un-masked bits) are to be written back to the array 212, the masking circuitry 233-1 can apply a bit mask to the unchanged bits to ensure that the unchanged bits are not written back to the array 212.

Once the decision circuitry 218 has attempted to correct one or more erroneous bits in the bit strings and/or syndromes 214, the bit strings and/or syndromes 214 can be transferred to an input of a logical gate 221. In some embodiments, when one or more bits of a bit string are corrected, a corresponding syndrome (which can reflect an error state corresponding to a bit string) can be updated to reflect a current error state of the syndrome. Although in some embodiments, it is the syndrome that is processed (e.g., by the multiplexer 205, the shift circuitry 216, the decision circuitry 218, the logic gate 221, etc.), the following non-limiting examples make reference to both bit strings and/or syndromes in order to illustrate various aspects of the present disclosure. As shown in FIG. 2, the logic gate 221 is a XOR gate, although embodiments are not limited to the utilization of a XOR gate. In embodiments in which the logic gate 221 comprises a XOR gate, the bit strings and/or syndromes 214 processed by the decision circuitry 218 are received as inputs by the logic gate 221 and a logical XOR operation is performed thereon. As will be appreciated, if the result of the logical XOR operation returns a value of zero, the bit string and/or syndrome 214 has successfully been decoded. In response to determining that the bit string and/or syndrome 214 has been successfully decoded, an indication that the bit string and/or syndrome 214 that has been successfully decoded is written to the array 225 and the de-multiplexer 209 is set such that further processing (e.g., retrieving from the array 212, shifting through the shift circuitry 216, processing by the decision circuitry 218, etc.) of that particular the bit string and/or syndrome 214 is avoided. It will be appreciated that, in general, it is the bit string that has been decoded because, as mentioned above, the syndrome generally reflects a current error state associated with data contained within the bit string and, once the value of the syndrome has reached zero, it implies that the bit string has been decoded; however, in keeping with the conventions outlined in the present disclosure, reference to both bit strings and/or syndromes is utilized in order to illustrate various aspects of the present disclosure.

Bit strings and/or syndromes 214 that are not successfully decoded, a quantity of bits that do not return a zero value after being passed through the logic gate 221 are processed by logic gate 232 or adder circuitry and a numerical value corresponding to the sum of the quantity of bits that do not return the zero value (e.g., a "tracking sum value") is written to the array 225. In general, the logic gate 232 can comprise a logical NAND gate and/or other adder circuitry that includes hardware and/or logic circuitry that is configured to perform addition operations to sum particular values (e.g., a quantity of bits associated with one or more bit strings and/or syndromes that have a logical value of "1" and/or a logical value of "0" associated therewith).

In some embodiments, the array 221 is configured to store one tracking sum value per bit string and/or syndrome 214 for each layer and/or iterations of the decoding operation. These bit strings and/or syndromes 214 are written back the array 212 via the de-multiplexer 209, and a subsequent iteration of the decoding operation is performed, as described above. It is noted that, in contrast to previous approaches in which all of the bit strings and/or syndromes 214 participate in the subsequent iteration of the decoding operation, embodiments herein provide that at least some of the bit strings and/or syndromes 214 do not participate in every subsequent iteration of the decoding process, thereby reducing the power consumed by the system 201 in performing the decoding operation. For example, at least because embodiments herein do not fire every row of the array 212 (as some of the bit strings and/or syndromes 214 that have been successfully decoded are not further processed), the amount of power consumed is decreased (1) due to firing fewer rows of the array 212 as the quantity of iterations of the decoding operation increases, (2) refraining from operating the shift circuitry 216 corresponding to bit strings and/or syndromes 214 that have been successfully decoded as the quantity of iterations of the decoding operation increases, and (3) refraining from operating the decision circuitry 218 for bit strings and/or syndromes 214 that have been successfully decoded as the quantity of iterations of the decoding operation increases.

In some embodiments, the logic gate 232 can be a NAND logic gate (among other types of logic gate). In embodiments in which a NAND gate is utilized for the logic gate 232, the logic gate 232 can receive as inputs bit strings/syndromes 214 that have been subject to one or more iterations of a decoding operation (e.g., bit strings/syndromes 214 that have been processed by the shift circuitry 216, the decision circuitry 218, and/or the logic circuitry 221). The logic gate 232 can be configured to output an indication corresponding to a quantity of bits that have not been successfully decoded within one or more of the syndromes 214 (or an indication corresponding to a quantity of bits that have been successfully decoded within one or more of the syndromes 214). In some embodiments, the indication can be as simple as a logical value of "1" indicating that one or more errors are present in the syndrome(s) or a logical value of "0" indicating that no errors are present in the syndrome(s). The indication can be analogous to the "tracking sum value" discussed above and can be written to the array 225, as discussed above.

The logic gate 234 can receive as inputs the tracking sum values written to the array 225 to determine if the decoding operation is complete. In some embodiments, the tracking sum values can be Boolean logic values (e.g., logical "1s" or logical "0s"). In some embodiments, the logic gate 234 can be used in place of threshold summation circuitries that perform independent determinations as to whether a decoding operation will converge (and therefore be successful) or will not converge (and therefore should be prematurely aborted as discussed above. In some embodiments, the logic gate 234 can comprise a NAND logic gate (among other types of logic gate). In embodiments in which the logic gate 234 comprises a NAND logic gate, the NAND logic gate can receive the tracking sum values corresponding to each of the bit strings and/or syndromes 214 and perform a logical operation to determine if the decoding operation is complete. If it is determined that the decoding operation is not complete, additional decoding operations can be performed on bit strings/syndromes 214 that have not been successfully decoded, as discussed above. If it is determined, based on the result of the logical operation performed by the logic gate 234 that the decoding operation is complete, an indication that the decode operation is complete can be transferred to circuitry external to the system 201.

As iterations of the decoding operation are performed, in general, logic gate 232 or adder circuitry will process an increasing quantity of bit strings and/or syndromes 214 that have been successfully decoded and will therefore process more bit strings and/or syndromes 214 that have a sum of bits (after being subjected to the logical gate 221) that is equal to zero. As this occurs, the logic gate 232 (or other adder circuitry) will cause re-writing (or overwriting in the case of bit strings and/or syndromes 214 that have previous sums of bits that do not equal zero from previous iterations of the decoding operation) an increasing quantity of tracking sum value that is equal to zero. Once the bit strings and/or syndromes 214 have all been successfully decoded, it can be determined at block 226 that the sum of all of the tracking sum values in the array 225 is equal to zero, thereby indicating that the decoding operation has been successfully performed on all of the bit strings and/or syndromes 214.

If, however, it appears that the tracking sum values of the bit strings and/or syndromes 214 may not converge to zero (e.g., there are too many uncorrectable errors in at least a threshold quantity of bit strings and/or syndromes 214 and/or correction of such errors is determined to take longer than a threshold period of time), it can be determined by the logic gate 234 that the decoding operation may not successfully conclude. That is, if at block 228 it is determined that a sum of the tracking sum values written to the array 221 is greater than a threshold error quantity value for the bit strings and/or syndromes 214, the decoding operation may not successfully complete, and the decoding operation can be aborted.

As mentioned above, in contrast to approaches in which a large adder circuit sums values associated with the bits in all the bit strings and/or syndromes 214 subsequent to one or more iterations of a decoding operation in order to determine if the decoding operation should be aborted, embodiments herein allow for the decoding operation to be aborted simply by checking whether a sum of all the tracking sum values written to the array 221 meets or exceeds a threshold value and, in response to determining that the sum of all the tracking sum values written to the array 221 meets or exceeds the threshold value, aborting the decoding operation. This feature can allow for simplified abortion of decoding operations that are determined to be unlikely to converge (e.g., to result in successful decoding of the bit strings and/or syndromes 214) as compared to previous approaches, thereby minimizing an amount of power consumed in performing iterations of a decoding operation that is likely to fail.

As shown in FIG. 2, an additional multiplexer 227 can be coupled to the array 225. The multiplexer 227 receive as inputs tracking sum values for the bit strings and/or syndromes 214 that have been written to the array 225. For tracking sum values corresponding to the bit strings and/or syndromes 214 that indicate that the bit strings and/or syndromes 214 have been successfully decoded (e.g., for tracking sum values equal to zero), an output signal can be transferred to the multiplexer 229 to cause the multiplexer 229 to deselect outputs of the multiplexer 229 corresponding to the bit strings and/or syndromes 214 that have been successfully decoded.

For tracking sum values corresponding to the bit strings and/or syndromes 214 that indicate that the bit strings and/or syndromes 214 have not been successfully decoded (e.g., for tracking sum values not equal to zero), an output signal can be transferred to the multiplexer 229 to select outputs of the multiplexer 229 corresponding to the current iteration and/or the previous iteration. In addition, an output signal can be transferred to the multiplexer 229 corresponding to selection between a "current layer" and a "previous layer." In general, when a syndrome has a value of zero, the previous layer is selected in order to effectively stall the data path thereby reducing an amount of power consumed by the system 201. In contrast, if the syndrome is not equal to zero, the current layer can be selected such that the syndrome is further processed as part of the decoding operation. In this manner, which of the bit strings and/or syndromes 214 are subjected to subsequent decoding operations and which of the bit strings and/or syndromes 214 are not subjected to subsequent decoding operations can be determined on, for example, a layer-by-layer, iteration-by-iteration, and/or bit string/syndrome-by-bit string/syndrome basis to minimize power consumption of the system 201 while performing the decoding operations described herein.

In a non-limiting example, an apparatus (e.g., the computing system 100 illustrated in FIG. 1, the decoding circuitry 113 illustrated in FIG. 1, the syndrome decoding system 201 illustrated in FIG. 2 and/or components thereof), includes a first array of memory cells 212 configured to store a plurality of syndromes 214 that each comprise a plurality of bits of data. The data correspond to an error state of data (e.g., can correspond to a syndrome). The first array of memory cells 212 can be coupled to first circuitry (e.g., the shift circuitry 216, the decision circuitry 218, and/or the masking circuitry 233-1 to 233-M, etc.). The first circuitry can alter at least one bit of at least one of the plurality of syndromes from a first value to a second value. In some embodiments, the first circuitry is further configured to alter the at least one bit of at least the one of the plurality of syndromes from the first value to the second value by altering a bit having a logical value of zero to a logical value of one or by altering a bit having a logical value of one to a logical value of zero.

The first circuitry can apply a bit mask to each bit of at least the one of the plurality of syndromes that is not altered from the first value to the second value. The first circuitry can further cause each bit of at least the one of the plurality of syndromes that does not have the bit mask applied thereto to a memory coupled to the first circuitry and write an indication corresponding to a quantity of bits that have been altered from the first value to the second value to a second array of memory cells, wherein the indication corresponds to a quantity of errors contained in at least the one of the plurality of syndromes.

Continuing with this non-limiting example, the first circuitry can be configured to refrain from performing a subsequent operation to alter at least the one bit of at least the one of the plurality of syndromes, or a different bit of at least the one of the plurality of syndromes, or both, from the first value to the second value in response to determining that the quantity of errors has reached a threshold quantity of errors.

In some embodiments, the apparatus further includes second circuitry (e.g., the logic gate 221, etc.) coupled to the first circuitry. The second circuitry can be configured to, for each of the plurality of syndromes, determine that the quantity of errors contained in at least the one of the syndromes has reached a threshold quantity of errors based on the quantity of errors contained in at least the one of the plurality of syndromes. The second circuitry can be further configured to, for each of the plurality of syndromes, determine that the quantity of errors for at least the one of the plurality of syndromes has reached the threshold quantity of errors when each bit among the quantity of bits for at least the one of the plurality of syndromes has a logical value of zero. Embodiments are not so limited, however, and in some embodiments, the second circuitry is configured to determine that the quantity of errors for at least the one of the plurality of syndromes has reached the threshold quantity of errors when a determination is made that at least the one of the plurality of syndromes cannot be decoded successfully. The determination that at least the one of the plurality of syndromes cannot be decoded successfully can be a determination that the syndrome will not converge to zero based on a quantity of uncorrectable errors being too great, a determination that an amount of time to decode the syndrome will be longer than a threshold period of time, etc.

As described above, the first circuitry can be configured to refrain from performing a subsequent operation to alter bits of at least the one of the plurality of syndromes that have the bit mask applied thereto. For example, the first circuitry can perform subsequent operations only on the bits that do not have the bit mask applied thereto. In some embodiments, the first circuitry is configured to perform the above operations as part of performance of a decoding operation to correct one or more bit-flip errors within at least the one of the plurality of syndromes.

In another non-limiting example, the system 201 includes shift circuitry 216 configured to shift bits of a syndrome 214 from a first memory array 212 to decision circuitry 218 coupled to the shift circuitry 216. The decision circuitry 218 is configured to, for a first iteration of an operation to decode the syndrome 214, alter at least one bit of the syndrome from a first value to a second value and determine a quantity of errors within the syndrome based on a quantity of bits having a particular logical value associated therewith. In some embodiments, the operation to decode the syndrome 214 can include execution of a low-density parity-check code. The decision circuitry 218 can further, for the first iteration of an operation to decode the syndrome 214, cause a tracking sum value based on the quantity of errors within the syndrome to be written to a second memory array 225.

Continuing with this non-limiting example, masking circuitry 233-M can be coupled to the decision circuitry 218. The masking circuitry 233-M can be configured to apply a bit mask to bits of the syndrome 214 that have not been altered from the first value to the second value and write the syndrome 214 having the bit mask applied thereto to a memory device 231 that is part of the masking circuitry 233-M. The masking circuitry 233-M can further be configured to write at least the bits that do not have the bit mask applied thereto to the decision circuitry 218.

In some embodiments, the decision circuitry 218 can be configured to, for a second iteration of the decoding operation, alter at least one bit of the syndrome 214 that does not have the bit mask applied thereto from the first value to the second value and determine an updated quantity of errors within the syndrome based on an updated quantity of bits having the particular logical value associated therewith. The decision circuitry 218 can further cause an updated tracking sum value based on the updated quantity of errors within the syndrome 214 to be written to the second memory array 225.

In some embodiments, the syndrome 214 can be one of a plurality of syndromes. In such embodiments, the shift circuitry 216 comprises a plurality of shift circuitries and the decision circuitry 218 comprises a plurality of decision circuitries. The shift circuitry 216 and the decision circuitry 218 can then be configured to process the plurality of syndromes concurrently.

Continuing with this non-limiting example, the system 201 can further include logic circuitry 232 coupled to the second memory array 225. The logic circuitry 232 can be configured to determine that the decoding operation is complete based on performance of a logical operation using the updated tracking sum value as a least one input for performance of the logical operation. Embodiments are not so limited, however, and in some embodiments, the logic circuitry 232 can be configured to determine that the decoding operation is to be aborted based on performance of a logical operation using the updated tracking sum value as a least one input for performance of the logical operation. As discussed above, by allowing for expedited abortion of the decoding operation when certain parameters are met, time and/or power can be saved in comparison to previous approaches.

Figure 3:
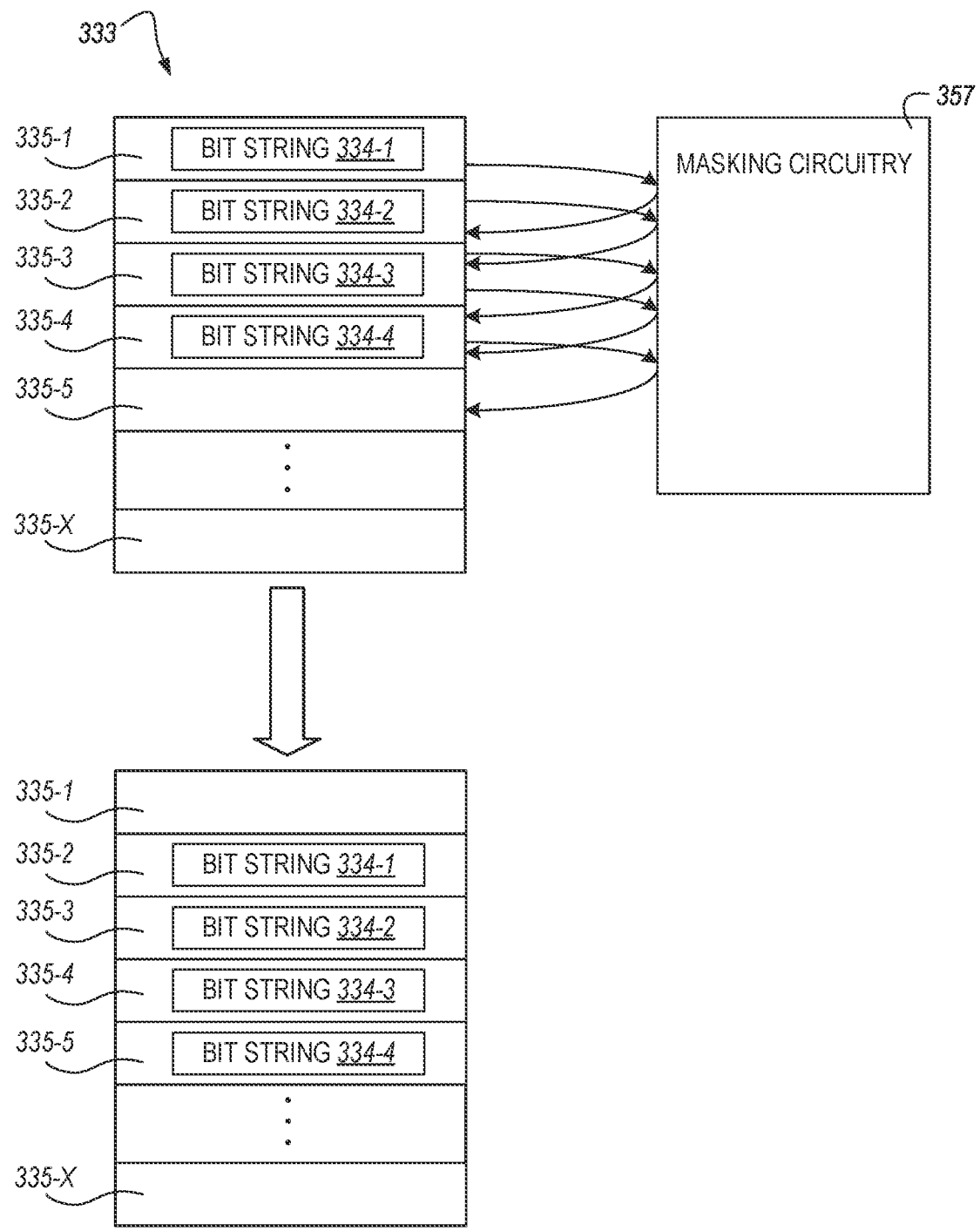
FIG. 3 illustrates an example of a shifting operation to move bit strings from one address location to another address location in accordance with some embodiments of the present disclosure.

FIG. 3 illustrates an example of a shifting operation to move bit strings from one address location to another address location in accordance with some embodiments of the present disclosure. As shown in FIG. 3, a register 333 (or other set of addressable memory locations) can include address locations 335-1, 335-2, 335-3, 335-4, 335-5, to 335-X (referred to collectively herein as "address locations 335"). Each of the address locations 335 can include a series of memory cells that can be configured to store data, such as a bit string, syndrome, codeword, etc. Accordingly, in some embodiments, the register 333 can be analogous to the array 212 illustrated in FIG. 2. Memory cells associated with the address locations 335 can be configured to store respective bit strings 334-1, 334-2, 334-2, to 334-4 (referred to collectively herein as "bit strings 334"). In some embodiments, the bit strings 334 can be analogous to the bit strings/syndromes 214 illustrated in FIG. 2. Although not explicitly shown in FIG. 3, the shifting operations described in FIG. 3 can be controlled by a controller or other processing device, such as the memory sub-system controller 115, the decoding circuitry 113, the processor 117, and/or the controller 415, etc.

In the non-limiting simplified example shown in FIG. 3, a bit string 334-4 is shifted from the address location 335-4 to the address location 335-5. The bit string 334-3 is shifted from the address location 335-3 to the address location 335-4, the bit string 334-2 is shifted from the address location 335-2 to the address location 335-3, and the bit string 334-1 is shifted from the address location 335-1 to the address location 335-2, thereby freeing up the address location 335-1 for a new incoming bit string. As indicated in FIG. 3, each time a bit string 334 is shifted from one address location 335 to a different address location 334, the bit string 334 is first transferred to masking circuitry 357. In some embodiments, the masking circuitry 357 can be analogous to the masking circuitry 233-1 and/or 233-M illustrated in FIG. 2, although embodiments are not so limited.

When the bit strings 334 are transferred to the masking circuitry 357 prior to being shifted to a new address location 335, the masking circuitry can be configured to apply a bit mask to the bit strings 334 based on one or more factors associated with the bit strings 334. For example, the masking circuitry 357 can include memory resources and/or logic circuitry that can allow for the bit strings 334 to be configured to perform a logical XOR operation (or other logical operation) using a bit string 334 that was previously received by the masking circuitry 357 as part of performing the shifting operation.

For example, the bit string 334-4 can be written from the address location to the masking circuitry 357 and then written to the address location 334-5 as shown in FIG. 3. A copy of the bit string 334-4 can be temporarily retained by the masking circuitry 357 for use in performance of a logical operation using the retained copy of the bit string 334-4 and the bit string 334-3. The logical operation can provide an indication of which bits will be altered (e.g., which bits are different between the bit string 334-4 and the bit string 334-3) in shifting the bit string 334-3 from the address location 335-3 to the address location 335-4. A bit mask can then be applied to the bit string 334-3 based on the indication provided by the logical operation and prior to writing the now masked bit string 334-3 to the address location 335-4. That is, instead of performing a read-write-modify operation to re-write the entire bit string 334-3 to the address location 335-4, a bit mask can be applied to the bit string 334-3 such that only the bits that are different than those of the bit string 334-4 that was previously stored in the address location 335-4 are altered. That is, any bits that have the mask applied thereto are not altered and are therefore generally not written back to, for example, one of the address locations 335 (and/or the memory 231 and/or the array 212 of FIG. 2), while bits that do not have the mask (e.g., "unmasked bits") may be modified and/or written back to such memory or storage locations.

Each of the remaining bit strings (e.g., the bit string 334-2, 334-1, etc.) can be processed in a similar manner during performance of the shifting operation described herein. For example, once the bit string 334-4 has been shifted to the address location 335-5, the bit string 334-3 can be temporarily retained by the masking circuitry 357 and a logical operation can be performed using the bit string 334-3 and the bit string 334-2 to aid in generating a bit mask, which can then be subsequently applied to the bit string 334-3 prior to writing the masked bit string 334-3 to the address location 335-4, and so on and so forth until each of the bit strings 334 have been shifted to the address locations shown in the bottom portion of FIG. 3.

As discussed herein, application of the bit mask in this manner can allow for power savings to be realized in a computing system, particularly during performance of operations that are traditionally read-write-modify operations. Further, fewer signals and/or fewer memory accesses (e.g., fewer entire re-writes of bit strings, etc.) can be realized in performance of the operations described herein in contrast to previous approaches, thereby reducing other adverse effects that may be present in a memory device, such as read/write disturb effects, etc.

Figure 4:
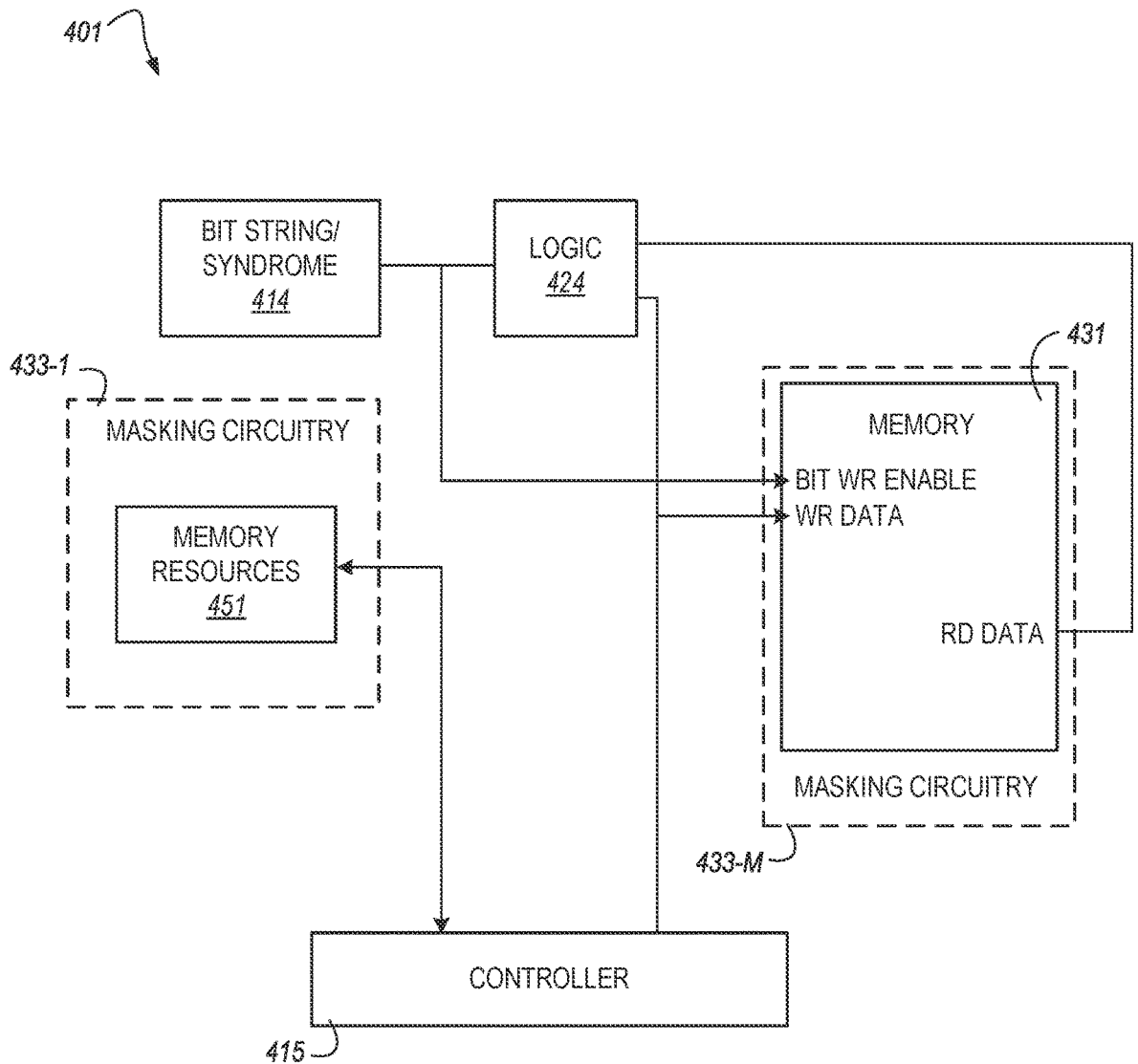
FIG. 4 illustrates another example of a syndrome decoding system in accordance with some embodiments of the present disclosure.

In a non-limiting example, an apparatus (e.g., the computing system 100, the systems 201/401 illustrated in FIG. 1, FIG. 2, and FIG. 4, herein, etc.) includes a register 333 comprising a plurality of address locations 335 each configurable to store one of a plurality of bit strings 334. In this example, masking circuitry 357 is coupled to the register 333. A controller (e.g., the memory sub-system controller 115, the decoding circuitry 113, and/or the processor 117, etc.) can be coupled to the register 333 and the masking circuitry 357. The controller can be configured to control performance of a shifting operation involving the plurality of bit strings 334 by, for a first phase of the shifting operation: (1) transferring a first bit string from a first address location in the register to the masking circuitry; (2) causing the masking circuitry to apply a bit mask to bits of the first bit string that will remain unchanged during the first phase of the shifting operation; and (3) transferring the first bit string having the bit mask applied thereto to a second address location of the register.

Continuing with this example, in some embodiments, the controller is further configured to control performance of the shifting operation involving the plurality of bit strings by, for a second phase of the shifting operation: (1) transferring the first bit string from the second address location in the register to the masking circuitry; (2) causing the masking circuitry to apply a bit mask to bits of the first bit string that will remain unchanged during the second phase of the shifting operation; (3) transferring the first bit string to a third address location of the register; (4) transferring a second bit string from the first address location in the register to the masking circuitry; (5) causing the masking circuitry to apply a bit mask to bits of the second bit string that will remain unchanged during the second phase of the shifting operation; and (6) transferring the second bit string to the second address location of the register.

FIG. 4 illustrates another example of a syndrome decoding system 401 in accordance with some embodiments of the present disclosure. The system 401 can be analogous to, or can be a portion of, the system 201/301 illustrated in FIG. 2 and FIG. 3, herein. In some embodiments, the system 401 can perform minimum sum decoding operations (among other operations such as cycle operations, manipulation operations, and/or data iteration operations, as described herein. In some embodiments, the system 401 can be operated to perform additional decoding on, for example, bit strings and/or syndromes that may be associated with aborted operations in FIG. 2. For example, in some embodiments, the system 401 may provide a higher likelihood of decoding (albeit at the expense of additional time) than the system 201 illustrated in FIG. 2 and can therefore be utilized to perform further operations to decode or otherwise cycle, manipulate, and/or iterate data for which such operations may have been aborted using different such decoding, cycling, manipulating, and/or iterating methodologies.

As shown in FIG. 4, the system 401 includes memory resources 451, which are included in masking circuitry 433-1, a memory 431, which is included in masking circuitry 433-M, and a controller 415. The controller is coupled to the memory 431 and the memory resources 451. The controller 415 is further coupled to logic circuitry 424, which is coupled to the memory 431. The masking circuitry can perform similar operations to the masking circuitry 233 and/or the masking circuitry 357 described herein in connection with FIG. 2 and FIG. 3. Further, the controller 415 can be analogous to the memory sub-system controller 115 of FIG. 1, the decision circuitry 218 of FIG. 2, etc. so long as the controller 415 includes hardware circuitry that can be configured to perform the operations described herein.

The memory resources 451 can include one or more memory areas that include arrays of memory cells configured to store various data corresponding to bit strings, syndromes, or other patterns of numerical information. For example, portions of the memory resources 451 can store sign values, minimum values, maximum values, identification values, etc. that can correspond to decoding, cycling, manipulating, and/or iterating various data written to the system 401. The data can be transferred to the controller 415 for further processing and/or to be transferred to different components of the system 401, as described herein.

The memory 431 can include various portions (e.g., pins, inputs, etc.) that correspond to enablement of bits for use in a write operation (e.g., according to the masking circuitry 433-M and whether or not a bit mask is applied to data received thereto), enablement of standard write operations, and/or enablement of read operations. For example, data can be written to the memory 431 at the WR DATA port of the memory 431 and masked data can be written to the memory 431 at the BIT WR ENABLE port of the memory. The data can be read from the memory 431 from the RD DATA port of the memory.

The controller 415 can retrieve information (e.g., data, bit strings, syndromes, etc.) from the memory resources 451 and cause such information to be transferred to memory 431 and/or the logic 424. For example, the controller 415 can cause information to be transferred (e.g., can cause signals to be asserted to control movement of information within the system 401) to a portion of the memory 431 that corresponds to a write operation being enabled. The information can be masked (e.g., by the masking circuitry 431-1 and/or the masking circuitry 431-M). That is, the masking circuitry 431-1 and/or the masking circuitry 431-M can selectively apply a bit mask to bits contained within one or more bit strings, syndromes, etc. to achieve the benefits described herein. In addition, the information (e.g., data, bit strings, syndromes, etc.) can be processed by the logic 424, and output as a bit string and/or syndrome (e.g., the syndrome 414). In some embodiments, such operations can be performed as part of an operation to decode one or more bit strings, syndromes, and/or other data, as described herein. As described above, operations are not limited to decoding of such bit strings, syndromes, and/or other data, however, and in some embodiments, the operations can be performed as part of cycling, manipulating, and/or iterating the bit strings, syndromes, and/or other data.

In a non-limiting example, an apparatus (e.g., the system 401) includes masking circuitry 433 comprising a memory device 431 and a controller 415 coupled to the memory device. In this example, the controller 415 can write a bit string (e.g., one or more of the bit string/syndromes 214/414 illustrated in FIG. 2 and FIG. 4 and/or one or more of the bit strings 334 illustrated in FIG. 3) to the memory device 431 via a first port (e.g., the WR DATA port) of the memory device 431. The masking circuitry 433 can apply a bit mask to the bit string and the memory device 431 can be configured to write the bit string having the bit mask applied thereto to circuitry (e.g., the logic 424) coupled to the memory device 431 via a second port (e.g., the RD DATA port). In some embodiments, the masking circuitry 433 can apply the bit mask to the bit string as part of performance of an operation to cycle, manipulate, or decode, or any combination thereof, the bit string, as described herein. In some embodiments, the masking circuitry 433 can be configured to apply the bit mask to the bit string based on receipt of information received to a third port (e.g., the BIT WR ENABLE port) of the memory device 431.

Continuing with this example, the bit string can, prior to being written to the memory device 431, have used in an operation to cycle, manipulate, or decode, or any combination thereof, the bit string that was aborted. For example, the bit string described here can be a bit string and/or syndrome that was processed in accordance with the description of FIG. 2 and was subjected to abortion of subsequent processing as described above. In such embodiments, the bit string (e.g., the bit string and/or syndrome that was determined to be a candidate for abortion of the processes described in connection with FIG. 2, herein) can be transferred to the memory resources 451 prior to the controller 415 transferring the bit string to the memory 431. In some embodiments, the bit string at issue can have a bit mask applied thereto by, for example, the masking circuitry 433-1 prior to being transferred to the memory device 431 (where such bit string may be subjected to one or more further bit masks by the masking circuitry 433-M).

Figure 5:
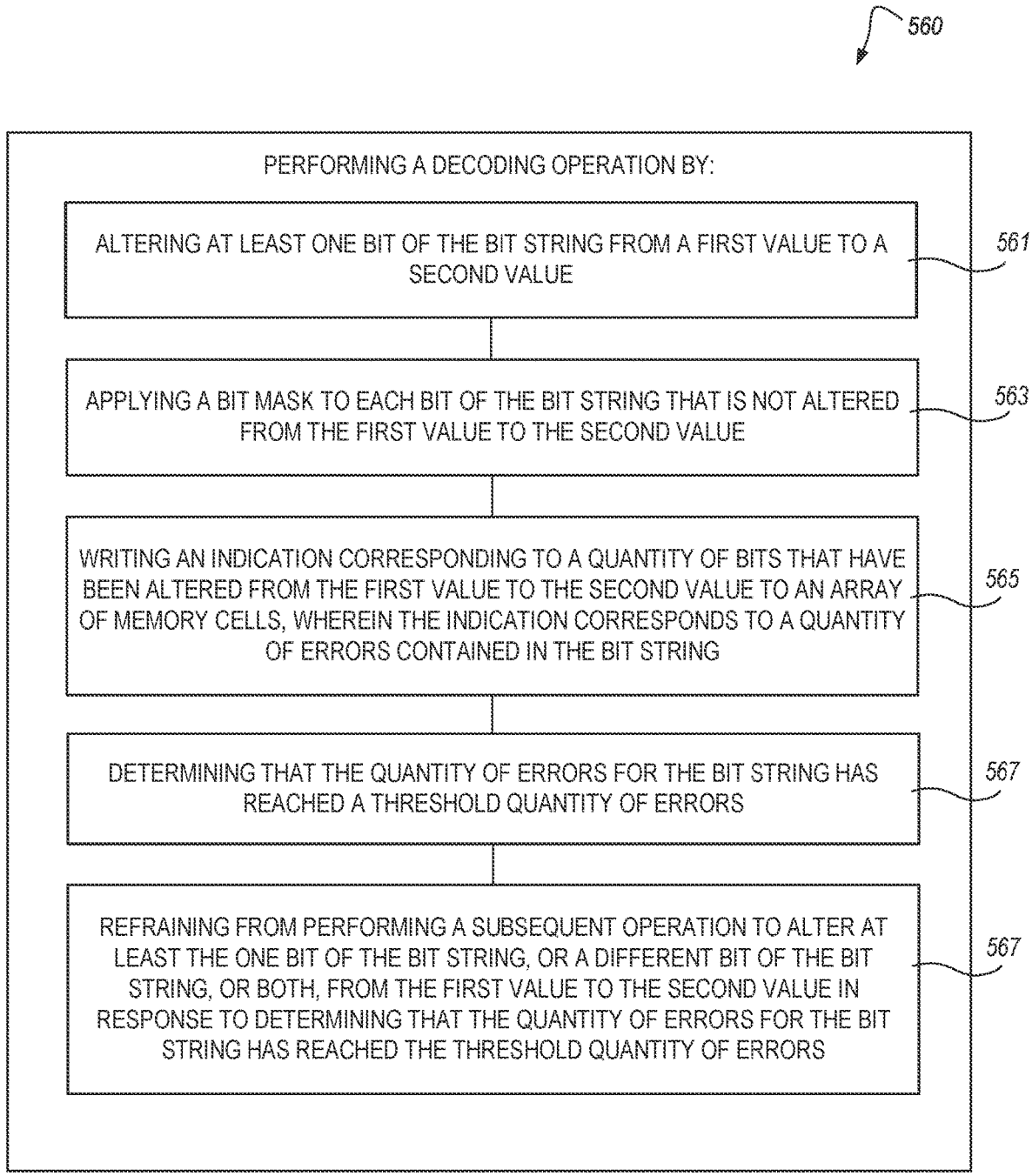
FIG. 5 is a flow diagram corresponding to a method for a bit mask for syndrome decoding operations in accordance with some embodiments of the present disclosure.

FIG. 5 is a flow diagram corresponding to a method 560 for a bit mask for syndrome decoding operations in accordance with some embodiments of the present disclosure. The method 560 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 560 is performed by the decoding circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 560 includes performing a decoding operation. As described above, the decoding operation can be performed to by utilizing a bit mask during operations to decode a bit string and/or a syndrome (e.g., the bit string(s) and/or syndromes(s) 214 illustrated in FIG. 2, herein). As described above, the decoding operation can be performed to correct one or more bit-flip errors within the bit string(s) and/or the syndrome(s) described herein.

At operation 561, the method 560 includes altering at least one bit of the bit string from a first value to a second value. For example, the method 560 can include altering at least one bit of the bit string from a logical value of "0" to a logical value of "1," or vice versa.

At operation 563 the method 560 includes applying a bit mask to each bit of the bit string that is not altered from the first value to the second value. In some embodiments, the method 550 includes applying the bit mask to each bit of the bit string that is not altered from the first value to the second value to cause each bit of the bit string that is not altered from the first value to the second value to not be altered for a subsequent iteration of the decoding operation.

At operation 560, the method 560 includes writing an indication corresponding to a quantity of bits that have been altered from the first value to the second value to an array of memory cells, wherein the indication corresponds to a quantity of errors contained in the bit string.

At operation 567 the method 560 includes determining that the quantity of errors for the bit string has reached a threshold quantity of errors. In some embodiments, the method 560 includes, prior to determining a quantity of errors for the bit string(s) and/or syndrome(s), determining a quantity of bits having a logical value of one ("1") within the bit string using decision circuitry (e.g., the decision circuitry 218 of FIG. 2). Embodiments are not so limited, however, and in some embodiments the method 560 can include prior to determining a quantity of errors for the bit string(s) and/or syndrome(s), determining a quantity of bits having a logical value of zero ("0") within the bit string using decision circuitry.

At operation 569 the method 560 includes refraining from performing a subsequent operation to alter at least the one bit of the bit string, or a different bit of the bit string, or both, from the first value to the second value in response to determining that the quantity of errors for the bit string has reached the threshold quantity of errors. The method 560 can further include refraining from performing the subsequent operation in order to reduce an amount of power consumed in operation of a computing system (e.g., the computing system 100 of FIG. 1, the system 201 of FIG. 2, etc.) in which the decoding operation on the bit string is performed.

In some embodiments, the method 560 can include determining that the quantity of errors for the bit string has not reached the threshold quantity of errors and performing a subsequent operation to alter at least the one bit of the bit string and/or a different bit of the bit string in response to determining that the quantity of errors for the bit string has not reached the threshold quantity of errors. In such embodiments, the method 560 can include performing the subsequent operation by altering at least the one bit of the bit string and/or the different bit of the bit string without altering bits of the bit string (and/or syndrome) that have the bit mask applied thereto.

In embodiments in which the bit string and/or the syndrome is one of a plurality of bit strings and/or syndromes that are decoded in parallel, the method 560 can include altering at least one bit of bit strings among the plurality of bit strings from the first value to the second value, applying the bit mask to each bit of the plurality of bit string that are not altered from the first value to the second value, and writing, for each of the plurality of bit strings, an indication corresponding to a quantity of bits that have been altered from the first value to the second value to an array of memory cells, wherein the indication corresponds to a quantity of errors contained in each of the plurality of bit strings. The method 450 can also include determining that the quantity of errors for at least one of the plurality of bit strings has reached a threshold quantity of errors and refraining from performing a subsequent operation to determine the quantity of errors for the at least one of the plurality of bit strings in response to determining that the quantity of errors for at least the one bit string of the plurality of bit strings has reached the threshold quantity of errors.

In some embodiments, the method 560 includes determining a quantity of errors for a bit string based on a quantity of bits having a logical value of one or a logical value of zero, or both, within the bit string. The bit string can be one or more of the bit strings and/or syndromes 214/414 discussed above in connection with FIG. 2 and FIG. 4.

Further, as described above, the logical value (e.g., the logical value of "1" and/or the logical value of "0" can be determined by processing the bit string during performance of a decoding operation as described above). In some embodiments, the method 560 can include determining the quantity of errors for the bit string by operating adder circuitry (e.g., the logic gate 232 of FIG. 2) that is configured to sum the quantity of bits having the logical value of one within the bit string.

As discussed above, the method 560 can further include determining the quantity of errors for the bit string as part of a decoding operation to correct one or more bit-flip errors within the bit string. For example, the bit string can comprise a syndrome and the method 560 can include performing a decoding operation on the syndrome as part of determining the quantity of errors for the bit string. In some embodiments, the method 560 can include determining the quantity of bits having the logical value of one within the bit string using decision circuitry (e.g., the decision circuitry 218 illustrated in FIG. 2, herein).

The method 560 includes writing an indication corresponding to the quantity of errors for the bit string to an array of memory cells. In some embodiments, the indication corresponding to the quantity of errors for the bit string can be a tracking sum value that is written to the array 225/ illustrated in FIG. 2, herein. The method 560 can further include determining that the quantity of errors for the bit string has reached a threshold quantity of errors. In some embodiments, determining that the quantity of errors for the bit string has reached a threshold quantity of errors can be performed by the logic gate 234 illustrated in FIG. 2.

The method 560 can further include refraining from performing a subsequent operation to determine the quantity of errors for the bit string in response to determining that the quantity of errors for the bit string has reached the threshold quantity of errors. For example, as described above, once a particular bit string has been successfully decoded (e.g., the determined tracking sum value associated with said bit string returns a string of zeros indicating that there are no erroneous bits contained in the bit string), subsequent decoding operations may not be performed on said bit string. In some embodiments, the method 560 can include refraining from performing the subsequent operation in order to reduce an amount of power consumed in operation of a computing system (e.g., the computing system 100 of FIG. 1, the syndrome decoding system 201 illustrated in FIG., etc.) in which the bit string is processed.

In some embodiments, the bit string is one of a plurality of bit strings that are processed in parallel. In such embodiments, the method 560 can include determining a quantity of errors for each of the plurality of bit strings based on a quantity of bits having a logical value of one for each of the plurality of bit strings and writing an indication corresponding to the quantity of errors for each of the plurality of bit strings to an array of memory cells. The method 560 can further include determining that the quantity of errors for at least one of the plurality of bit strings the bit string has reached a threshold quantity of errors and refraining from performing a subsequent operation to determine the quantity of errors for the at least one bit string in response to determining that the quantity of errors for the bit string has reached the threshold quantity of errors.

Figure 6:
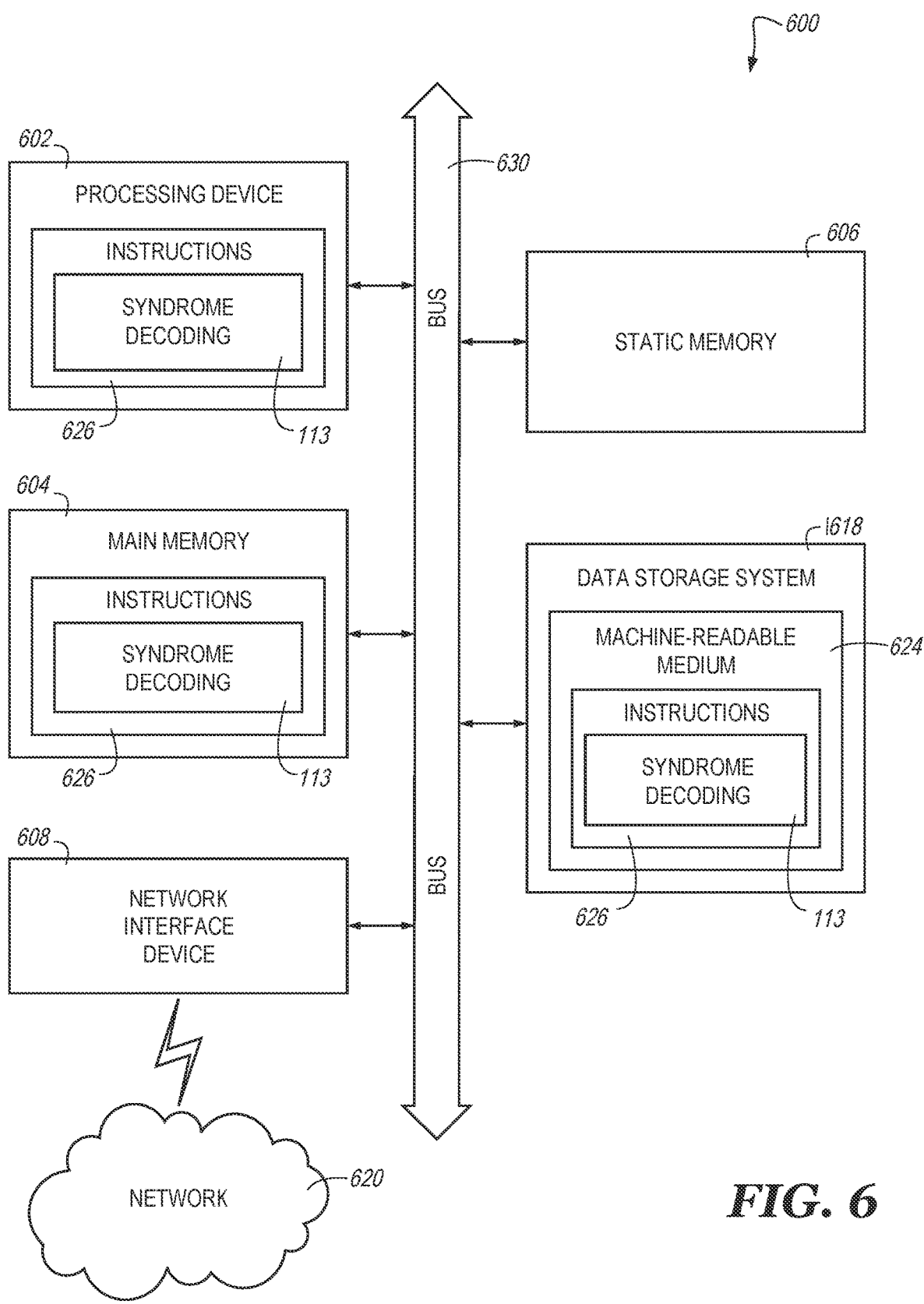
FIG. 6 is a block diagram of an example computer system in which embodiments of the present disclosure may operate.

FIG. 6 is a block diagram of an example computer system in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the decoding circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to syndrome decoding circuitry (e.g., the decoding circuitry 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
performing a decoding operation on a bit string by:
altering at least one bit of the bit string from a first value to a second value;
applying a bit mask to each bit of the bit string that is not altered from the first value to the second value such that the bit string includes at least one bit with the bit mask applied thereto and at least the one altered bit;
writing an indication corresponding to a quantity of bits that have been altered from the first value to the second value to an array of memory cells, wherein the indication corresponds to a quantity of errors contained in the bit string;
determining that the quantity of errors for the bit string has reached a threshold quantity of errors; and
refraining from performing a subsequent operation to alter at least the one altered bit of the bit string, or a different bit of the bit string, or both, from the first value to the second value in response to determining that the quantity of errors for the bit string has reached the threshold quantity of errors.

2. The method of claim 1, further comprising performing the decoding operation to correct one or more bit-flip errors within the bit string.

3. The method of claim 1, further comprising refraining from performing the subsequent operation in order to reduce an amount of power consumed in operation of a computing system in which the decoding operation on the bit string is performed.

4. The method of claim 1, further comprising applying the bit mask to each bit of the bit string that is not altered from the first value to the second value to cause each bit of the bit string that is not altered from the first value to the second value to not be altered for a subsequent iteration of the decoding operation.

5. The method of claim 1, further comprising:
determining that the quantity of errors for the bit string has not reached the threshold quantity of errors;
performing a subsequent operation to alter at least the one altered bit of the bit string, or a different bit of the bit string, or both in response to determining that the quantity of errors for the bit string has not reached the threshold quantity of errors, wherein performing the subsequent operation comprises altering at least the one altered bit of the bit string, or the different bit of the bit string, or both, without altering bits of the bit string that have the bit mask applied thereto.

6. The method of claim 1, wherein, prior to determining a quantity of errors for the bit string the method comprises determining a quantity of bits having a logical value of one within the bit string using decision circuitry.

7. The method of claim 1, wherein the bit string is one of a plurality of bit strings that are decoded in parallel, and wherein the method further comprises:
altering at least one bit of bit strings among the plurality of bit strings from the first value to the second value;
applying the bit mask to each bit of the plurality of bit strings that are not altered from the first value to the second value such that each bit string of the plurality of bit strings includes at least one bit with the bit mask applied thereto and at least the one altered bit;
writing, for each of the plurality of bit strings, an indication corresponding to a quantity of bits that have been altered from the first value to the second value to an array of memory cells, wherein the indication corresponds to a quantity of errors contained in each of the plurality of bit strings;
determining that the quantity of errors for at least one of the plurality of bit strings has reached a threshold quantity of errors; and
refraining from performing a subsequent operation to determine the quantity of errors for at least the one bit string of the plurality of bit strings in response to determining that the quantity of errors for at least the one bit string of the plurality of bit strings has reached the threshold quantity of errors.

8. An apparatus, comprising:
a first array of memory cells configured to store a plurality of syndromes that each comprise a plurality of bits of data; and
first circuitry coupled to the first array and configured to:
alter at least one bit of at least one of the plurality of syndromes from a first value to a second value;
apply a bit mask to each bit of at least the one of the plurality of syndromes that is not altered from the first value to the second value such that at least the one of the plurality of syndromes includes at least one bit with the bit mask applied thereto and at least the one altered bit;
cause each bit of at least the one of the plurality of syndromes that does not have the bit mask applied thereto to be written to a memory coupled to the first circuitry;
write an indication corresponding to a quantity of bits that have been altered from the first value to the second value to a second array of memory cells, wherein the indication corresponds to a quantity of errors contained in at least the one of the plurality of syndromes.

9. The apparatus of claim 8, wherein the first circuitry is configured to refrain from performing a subsequent operation to alter at least the one altered bit of at least the one of the plurality of syndromes, or a different bit of at least the one of the plurality of syndromes, or both, from the first value to the second value in response to determining that the quantity of errors has reached a threshold quantity of errors.

10. The apparatus of claim 8, further comprising second circuitry coupled to the first circuitry, wherein the second circuitry is configured to, for each of the plurality of syndromes, determine that the quantity of errors contained in at least the one of the syndromes has reached a threshold quantity of errors based on the quantity of errors contained in at least the one of the plurality of syndromes.

11. The apparatus of claim 10, wherein the second circuitry is configured to, for each of the plurality of syndromes, determine that the quantity of errors for at least the one of the plurality of syndromes has reached the threshold quantity of errors when each bit among the quantity of bits for at least the one of the plurality of syndromes has a logical value of zero.

12. The apparatus of claim 10, wherein the second circuitry is configured to determine that the quantity of errors for at least the one of the plurality of syndromes has reached the threshold quantity of errors when a determination is made that at least the one of the plurality of syndromes cannot be decoded successfully.

13. The apparatus of claim 8, wherein the first circuitry is further configured to alter the at least one bit of at least the one of the plurality of syndromes from the first value to the second value by altering a bit having a logical value of zero to a logical value of one or by altering a bit having a logical value of one to a logical value of zero.

14. The apparatus of claim 8, wherein the first circuitry is configured to refrain from performing a subsequent operation to alter bits of at least the one of the plurality of syndromes that have the bit mask applied thereto.

15. The apparatus of claim 8, wherein the first circuitry is configured to perform the operations of altering, applying, causing, and writing as part of performance of a decoding operation to correct one or more bit-flip errors within at least the one of the plurality of syndromes.

16. A system, comprising:
shift circuitry configured to shift bits of a syndrome from a first memory array to decision circuitry coupled to the shift circuitry, wherein the decision circuitry is configured to, for a first iteration of an operation to decode the syndrome:
  alter at least one bit of the syndrome from a first value to a second value;
  determine a quantity of errors within the syndrome based on a quantity of bits having a particular logical value associated therewith; and
  cause a tracking sum value based on the quantity of errors within the syndrome to be written to a second memory array;
masking circuitry coupled to the decision circuitry, wherein the masking circuitry is configured to:
  apply a bit mask to bits of the syndrome that have not been altered from the first value to the second value such that the syndrome includes at least one bit with the bit mask applied thereto and at least the one altered bit;
  write the syndrome having the bit mask applied thereto to a memory device that is part of the masking circuitry; and
  write at least the bits of the syndrome that do not have the bit mask applied thereto to the decision circuitry.

17. The system of claim 16, wherein the decision circuitry is configured to, for a second iteration of the decoding operation:
  alter at least one bit of the syndrome that does not have the bit mask applied thereto from the first value to the second value;
  determine an updated quantity of errors within the syndrome based on an updated quantity of bits having the particular logical value associated therewith; and
  cause an updated tracking sum value based on the updated quantity of errors within the syndrome to be written to the second memory array.

18. The system of claim 16, wherein the operation to decode the syndrome comprises execution of a low-density parity-check code.

19. The system of claim 16, wherein:
the syndrome is one of a plurality of syndromes,
the shift circuitry comprises a plurality of shift circuitries,
the decision circuitry comprises a plurality of decision circuitries, and
the shift circuitry and the decision circuitry are configured to process the plurality of syndromes concurrently.

20. The system of claim 16, further comprising logic circuitry coupled to the second memory array, wherein the logic circuitry is configured to determine that the decoding operation is complete based on performance of a logical operation using the updated tracking sum value as a least one input for performance of the logical operation.

21. The system of claim 16, further comprising logic circuitry coupled to the second memory array, wherein the logic circuitry is configured to determine that the decoding operation is to be aborted based on performance of a logical operation using the updated tracking sum value as a least one input for performance of the logical operation.

22. An apparatus, comprising:
a register comprising a plurality of address locations each configurable to store one of a plurality of bit strings;
masking circuitry coupled to the register; and
a controller coupled to the register and the masking circuitry, wherein the controller is configured to control performance of a shifting operation involving the plurality of bit strings by, for a first phase of the shifting operation:
  transferring a first bit string from a first address location in the register to the masking circuitry;
  causing the masking circuitry to apply a bit mask to bits of the first bit string that will remain unchanged during the first phase of the shifting operation such that the first bit string includes at least one bit with the bit mask applied thereto and at least one bit without the bit mask applied thereto; and
  transferring the first bit string having the bit mask applied thereto to a second address location of the register.

23. The apparatus of claim 22, wherein the controller is further configured to control performance of the shifting operation involving the plurality of bit strings by, for a second phase of the shifting operation:
  transferring the first bit string from the second address location in the register to the masking circuitry;
  causing the masking circuitry to apply a bit mask to bits of the first bit string that will remain unchanged during the second phase of the shifting operation;
  transferring the first bit string to a third address location of the register;
  transferring a second bit string from the first address location in the register to the masking circuitry;
  causing the masking circuitry to apply a bit mask to bits of the second bit string that will remain unchanged during the second phase of the shifting operation such that the second bit string includes at least one bit with the bit mask applied thereto and at least one bit without the bit mask applied thereto; and
  transferring the second bit string to the second address location of the register.

24. An apparatus, comprising:
masking circuitry comprising a memory device; and
a controller coupled to the memory device, wherein:
   the controller is configured to write a bit string to the memory device via a first port of the memory device,
   the masking circuitry is configured to apply a bit mask to the bit string such that the bit string includes at least one bit with the bit mask applied thereto and at least one bit without the bit mask applied thereto, and
   the memory device is configured to write the bit string having the bit mask applied thereto to circuitry coupled to the memory device via a second port.

25. The apparatus of claim 24, wherein the masking circuitry is configured to apply the bit mask to the bit string as part of performance of an operation to cycle, manipulate, or decode, or any combination thereof, the bit string.

26. The apparatus of claim 24, wherein the bit string was, prior to being written to the memory device, used in an operation to cycle, manipulate, or decode, or any combination thereof, the bit string that was aborted.

27. The apparatus of claim 24, wherein the masking circuitry is configured to apply the bit mask to the bit string based on receipt of information received to a third port of the memory device.

* * * * *